United States Patent [19]

McDermott, III

[11] Patent Number: 4,549,283
[45] Date of Patent: Oct. 22, 1985

[54] DIGITAL TIME DELAY CIRCUIT WITH HIGH SPEED AND LARGE DELAY CAPACITY

[75] Inventor: Thomas C. McDermott, III, Plano, Tex.

[73] Assignee: Rockwell International Corporation, El Segundo, Calif.

[21] Appl. No.: 529,302

[22] Filed: Sep. 6, 1983

[51] Int. Cl.[4] .............................................. G11C 13/00
[52] U.S. Cl. ..................................... 365/194; 365/189
[58] Field of Search ............... 365/189, 194, 230, 239, 365/240

[56] References Cited

U.S. PATENT DOCUMENTS 4,415,994 11/1983 Ive et al. ............................. 365/189

Primary Examiner—Joseph A. Popek
Attorney, Agent, or Firm—V. Lawrence Sewell; Howard R. Greenberg; H. Fredrick Hamann

[57] ABSTRACT

A delay circuit including an even number of memory devices, for example two, reading from one memory device, while writing to the other. Sequences of bit addresses are generated for writing and reading, with an offset between the sequences. For the case of two memory devices, each address sequence is applied alternately to the one and then the other memory device. Importantly, if each memory device has an even number n of storage locations, then, preferably, only (n-1) of these are used in the generated sequences of addresses. This has the result that the circuit can write to and read from all of the memory locations in the memory devices. Thus, the maximum delay possible in the circuit of the invention is nearly the total number of bits in the multiple memory devices, and the circuit is capable of handling data at the maximum operating rate of the memory devices.

6 Claims, 5 Drawing Figures

DIGITAL TIME DELAY CIRCUIT WITH HIGH SPEED AND LARGE DELAY CAPACITY

BACKGROUND OF THE INVENTION

The present invention relates to digital time delay circuits of the type in which data is read into memory in a circulating fashion and read from the memory in a similar fashion, except that the read addresses are offset from the write addresses so as to produce a selected time delay.

In a prior art approach to the type of time delay circuit described, a single memory device with plural storage locations is used. Data is written into the memory and read from it on alternate cycles. A limitation of such an approach is that the memory can accept data at only half the maximum operating rate of the memory device.

A second prior art approach is shown in FIG. 1. There, two eight bit memory devices R and S are illustrated. It should be borne in mind that in such delay circuits, the storage locations employed typically number in the thousands; the small memory devices shown herein are for purposes of illustration. In FIG. 1, numbers 0 through 7 are shown beside small blocks representing bit storage locations. The numbers represent the addresses of the locations. Both read and write addresses are generated by a counter which counts repeatedly from 0 to 7. The address thus generated is alternately applied to memory R and memory S. The results of applying the write address in this fashion are shown for a sequence of bits b0-b7. Bit b0 is stored in location 0 of memory R, while the next bit b1 is stored in location 1 of memory S, etc. After the storage of bit b7 in location 7 of memory S, then the next bit is stored in location 0 of memory R.

To achieve a delay of, say, five bit intervals, the read address could begin accessing location 0 of memory R, while the write address is entering a bit in location 5 of memory S. The advantage of the operation of FIG. 1 is that memory S can be written into at the same time memory R is being read from and vice versa. This enables the memories to process data at the maximum operating rate of the memory devices.

The disadvantage of the operation of FIG. 1 is that half the memory locations in the memory devices are not used. Thus, for a given delay, there will be required memory devices having twice the number of storage locations as the number of bit intervals required for the delay.

SUMMARY OF THE INVENTION

In accordance with the present invention, there is provided a delay circuit overcoming the described limitations of the prior art. The delay circuit of the invention includes an even number of memory devices, for example, two, reading from one memory device, while writing to the other. Sequences of bit addresses are generated for writing and reading, with an offset between the sequences. For the case of two memory devices, each address sequence is applied alternately to one and then the other memory device. Importantly, if each memory device has an even number n of storage locations, then, preferably, only (n−1) of these are used in the generated sequences of addresses. This has the result that the circuit can write to and read from all of the memory locations in the memory devices.

Thus, the maximum delay possible in the circuit of the invention is approximately the total number of bits in the multiple memory devices, rather than approximately half that number of bits. In addition, since reading and writing are carried out simultaneously, the circuit of the invention is capable of handling data at the maximum operating rate of the memory devices.

DESCRIPTION OF PREFERRED EMBODIMENT

Figure 2:
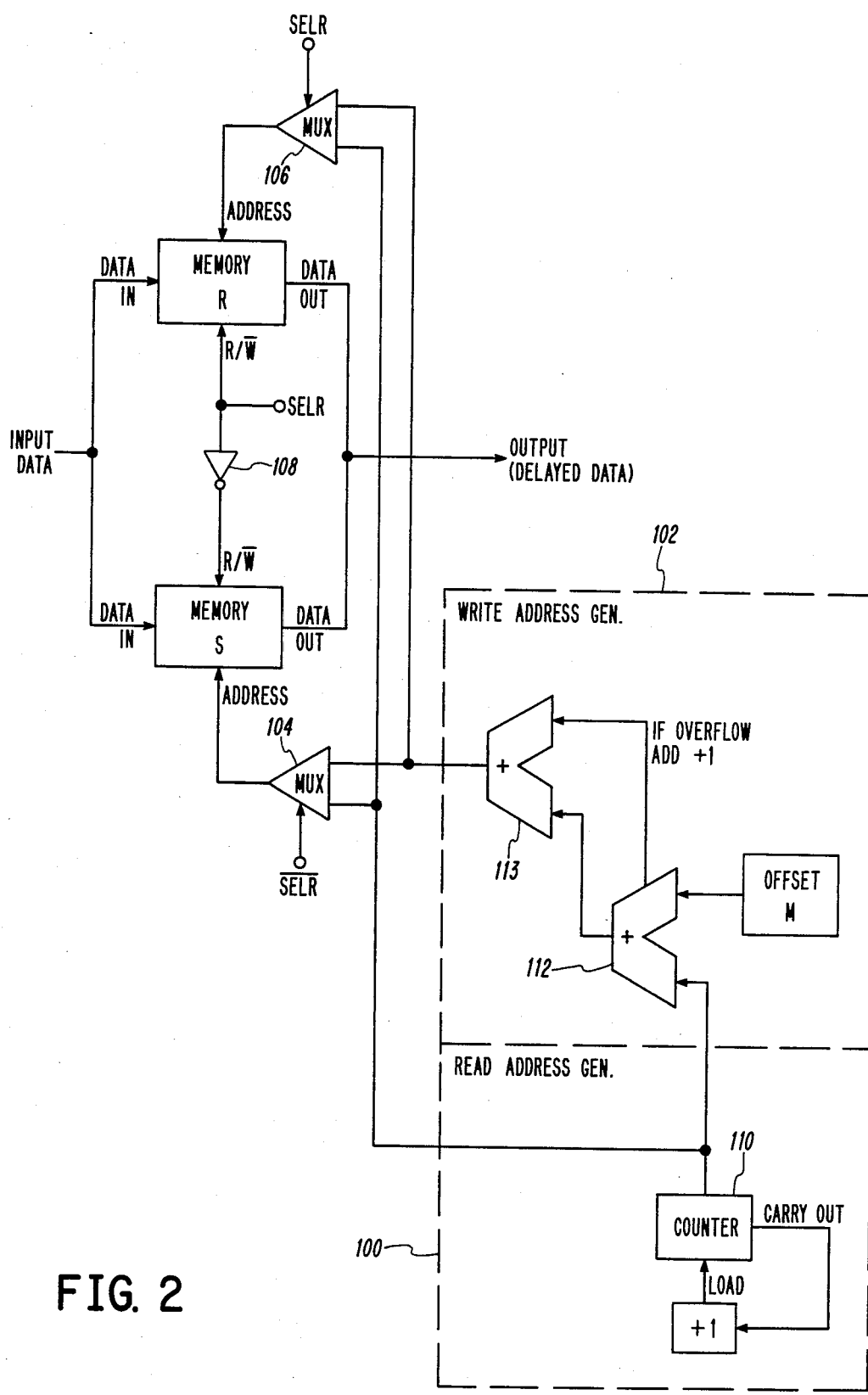
FIG. 2 is a schematic diagram of a delay circuit in accordance with the invention.
Figure 3:
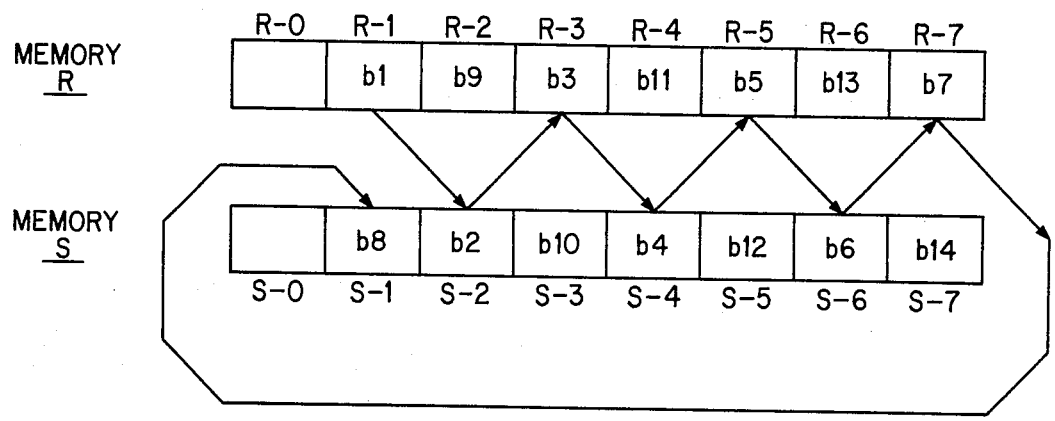
FIG. 3 is a schematic diagram of reading and writing of bits in memory locations of the delay circuit of FIG. 2.

FIG. 2 illustrates a preferred embodiment of a delay circuit in accordance with the invention. The circuit of FIG. 2 is best understood in terms of the memory operation which it provides, as illustrated in FIG. 3. In that figure are shown blocks representing bit storage locations in two memory devices, R and S. For purposes of illustration, each memory device has eight locations, with addresses 0-7, labeled R-0 through R-7 and S-0 through S-7. In FIG. 2, a read address generator generates an address sequence by repeatedly outputting the subset of addresses 1, 2, 3 . . . 7. A write address generator 102 generates a sequence of this same repeated subset, except offset from the sequence of the read address generator, so as to create a delay.

The write addresses and read addresses from generators 100 and 102 are each taken to multiplexers 104 and 106. At multiplexer 106, a select signal SELR of alternating 1's and 0's applies alternately the write address and the read address to memory R. At multiplexer 104, $\overline{\text{SELR}}$ causes the write address to be applied to memory S, when the read address is being applied to memory R, and vice versa. The select signal SELR is also applied to read/ write controls, R/$\overline{\text{W}}$, directly and through inverter 108, to direct each memory to perform a write, when the write address is present and a read when the read address is present.

Read address generator 100 includes a three bit counter 100 which is incremented each bit interval. Ordinarily, the counter would be arranged such that the count would repeatedly increment from 0 to 7. In this case, however, the carry output of the counter is connected so that when a carry indication occurs, a count of one is loaded into the counter. Since the carry indication occurs when incrementing from a count of 7, the output from counter 110 repeatedly counts from 1 to 7.

In write address generator 102, an offset m is added to the read address at summer 112, in order to create the bit delay of the circuit. The overflow bit from summer 112 is added with the output of summer 112 at summer 113 to generate the write address. As a result, the write address also repeatedly counts from address 1 to 7, but it is m bits ahead of the read address.

Figure 4:
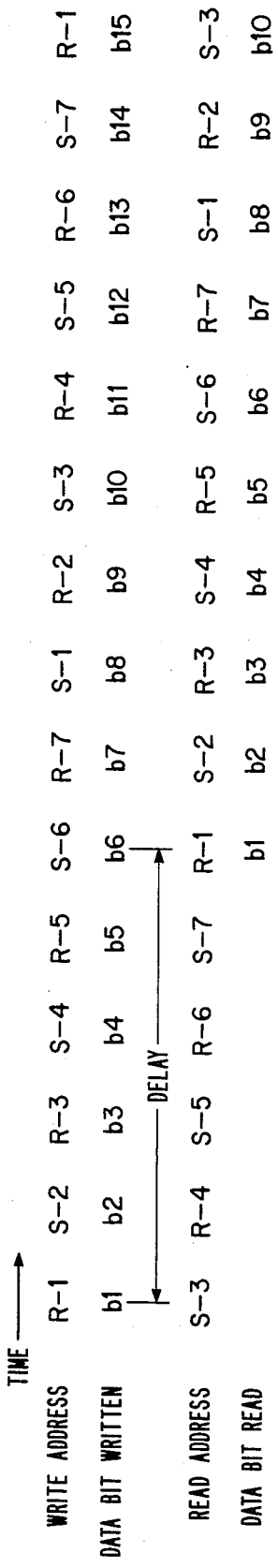
FIG. 4 is a sequence of columns showing the occurrence of the read and write operations of FIG. 3 as they occur at successive bit intervals, assuming an offset of five bit intervals between read and write addresses.

Returning to FIG. 3, a string of bits b1-b9 is shown being written to and read from locations in memories R and S. Bit b1 is written in address 1 of memory R. The next address in the write address sequence is 2. Because of the action of select signal SELR, this write address 2 is applied to memory S. Thus, as shown in FIG. 3, the second bit b2 is written in memory location 2 of memory S. These two operations are recorded in the first two columns of FIG. 4, in which each column records the reading and writing events for a particular bit interval. FIG. 4 illustrates an example in which the reading and writing are offset by m equal to 5 bit intervals.

Figure 1:
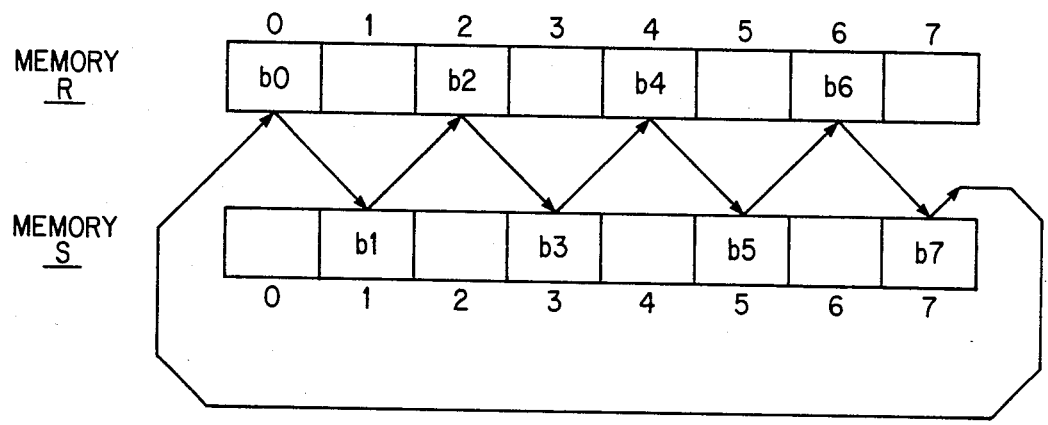
FIG. 1 is a schematic representation of patterns of reading and writing in memory locations of a prior art device.

Examining the sequence of write events further in FIGS. 3 and 4, it is seen that bits b3-b7 are written in memory locations R-3, S-4, R-5, S-6 and R-7, respectively. Since the next address after 7 is 1, bit b8 is written in location S-1. The remaining bits are written as shown in both FIGS. 3 and 4. Contrasting FIG. 3 with FIG. 1, it can be seen that all but two of the memory locations in FIG. 3 are utilized, while in FIG. 1 only half of them are.

The read sequence shown in FIG. 4 is the same as the write sequence except offset by 5, that is, while bit b6 is being written in address S-6, the bit b1 previously written in address R-1 is being read. For the circuit according to the invention, if the offset m is an odd number, then the delay is equal to the offset.

Figure 5:
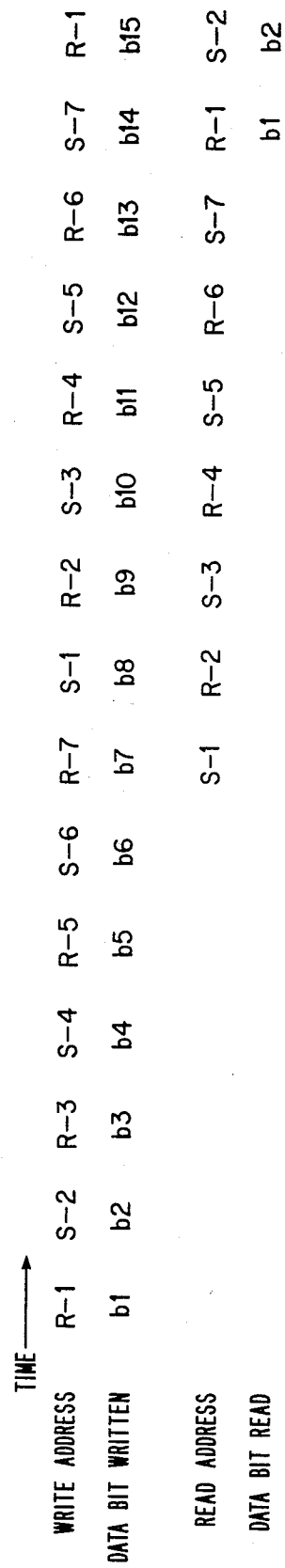
FIG. 5 shows reading and writing operations at successive bit intervals for the circuit of FIG. 2, assuming an offset value of six bit intervals between read and write addresses.

FIG. 5 shows an example in which the offset m equals 6. As can be seen in the Figure, at the time bit b7 is being written into write address R-7, address S-1 is being read. On the next interval, bit b8 will be written into address S-1, but at the time when address S-1 is read, this has not occurred, so the location contains data older than bits b1-b15. It is not until the next-to-the-last column in the Figure, when address R-1 is read, that one of the bits b1-b15 is present. Thus, while the offset m is equal to 6, the delay provided by the circuit is 13 bit intervals. This is the maximum delay possible for the configuration of two 8 bit memories shown in FIG. 2. Thus, using 16 bits of storate capability, the circuit of the invention provides 13 bit intervals of delay.

In general, the maximum delay which can be provided by the circuit of the invention, having two memory devices, each with an even number n of memory locations is (2n-3). The quantity 2n is the total number of memory locations available. From this number must be subtracted the two memory locations with address 0. Another location must be subtracted, because the circuit does not read and write into the same location during the same bit interval.

When the offset m is an even number of bit intervals, the delay is equal to (m+n−1). For the maximum delay (2n−3), the value of m can be found to be (n−2).

By extension from the circuit of the circuit illustrated, the invention also comprehends the use of 2i storage devices, where i is a positive integer. For an even number n of storage locations in each device, with the n addresses forming an ordered set, the sequence of write addresses (or read addresses) generated will be a repetition of a subset of the ordered set of addresses. The number of addresses in the subset is an odd number, preferably n−1. In each storage device, one location is not used. As with the examples shown for two devices, the circuit does not read and write to the same location during the same bit interval. Therefore, the expression for maximum delay n, this more general case is (2n−2i−1).

The present invention thus permits handling of data at the maximum operating rate of the memory devices, by reading from one device, while writing to the other. At the same time, all but two of the storage locations are available for bit storage, and the maximum delay possible is (2n−3) for two n-bit storage devices. Where n numbers in the thousands, the circuit uses practically all of the storage locatons available.

I claim:

1. A digital time delay circuit, comprising:
an even number of memory devices, each of said devices including a plurality of storage locations with addresses forming an ordered set;
means for directing a write address to a first one of said memory devices, while directing a read address to a second one of said devices, then directing a write address to one of said devices different from said first one, while directing a read address to one of said devices different from said second one;
means for generating a sequence of said write addresses and a sequence of said read addresses, each of said sequences being formed by the repetition of a subset of said ordered set, said subset having an odd number of addresses,
whereby an offset between said write address sequence and said read address sequence can be selected to provide a delay, and
whereby the odd number of addresses in said subset permits utilization of adjacent storage locations in said memory devices.

2. A digital time delay circuit, comprising:
two memory devices, each of said devices including a plurality of storage locations with addresses forming an ordered set;
means for directing a write address to a first one of said memory devices, while directing a read address to the other of said devices, then directing a write address to said other of said devices, while directing a read address to said one of said devices;
means for generating a sequence of said write addresses and a sequence of said read addresses, each of said sequence being formed by the repetition of a subset of said ordered set, said subset having an odd number of addresses,
whereby an offset between said write sequence and said read address sequence can be selected to provide a delay, and
whereby the odd number of addresses in said subset permits utilization of adjacent storage locations in said memory devices.

3. The circuit of claim 2, wherein each of said devices includes a plurality n of storage locations, and said subset has (n−1) addresses.

4. The circuit of claim 3, wherein said means for generating a sequence of write addresses and sequence of read addresses includes a counter having a carry output and having associated therewith means for loading the counter in response to said carry output.

5. The circuit of claim 1, wherein said means for generating a sequence of write addresses and a sequence of read addresses includes:
means for generating one of said address sequences,
means for summing said one address sequence with an offset number m, yielding a first sum and an overflow output, and means for summing said first sum and said overflow output to provide the other of said address sequences.

6. A digital time delay circuit, comprising:
two memory devices, each of said devices including a plurality n of storage locations with addresses forming an ordered set;
means for directing a write address to a first one of said memory devices, while directing a read address to the other of said devices, then directing a write address to said other of said devices, while directing a read address to said one of said devices;
means for generating a sequence of said write addresses and a sequence of said read addresses, each of said sequences being formed by the repetition of a subset of said ordered set, said subset having an odd number $(n-1)$ of addresses, said means for generating including
a counter having a carry output and having associated therewith means for loading the counter in response to said carry output, the count of said counter representing one of said address sequences,
means for summing said one address sequence with an offset number m, yielding a first sum and an overflow output, and
means for summing said first sum and said overflow output to provide the other of said address sequences,
whereby said offset number m can be selected to provide a delay, and
whereby the odd number of addresses in said subset permits utilization of adjacent storage locations in said memory devices.

* * * * *